(12) United States Patent
Tan

(10) Patent No.: US 11,086,788 B2
(45) Date of Patent: Aug. 10, 2021

(54) METHODS AND APPARATUS FOR ACCESSING CONFIGURABLE MEMORY DURING HARDWARE EMULATION

(71) Applicant: Intel Corporation, Santa Clara, CA (US)

(72) Inventor: Jun Pin Tan, Kepong (MY)

(73) Assignee: Intel Corporation, Santa Clara, CA (US)

( * ) Notice: Subject to any disclaimer, the term of this patent is extended or adjusted under 35 U.S.C. 154(b) by 1112 days.

(21) Appl. No.: 15/599,122

(22) Filed: May 18, 2017

(65) Prior Publication Data

US 2018/0336935 A1   Nov. 22, 2018

(51) Int. Cl.
| | |
|---|---|
| *G06F 12/1009* | (2016.01) |
| *G11C 29/00* | (2006.01) |
| *G11C 29/04* | (2006.01) |
| *G06F 30/33* | (2020.01) |
| *G06F 30/331* | (2020.01) |
| *G11C 29/08* | (2006.01) |
| *G11C 29/48* | (2006.01) |

(52) U.S. Cl.
CPC .......... *G06F 12/1009* (2013.01); *G11C 29/00* (2013.01); *G11C 29/08* (2013.01); *G11C 29/48* (2013.01); *G06F 30/33* (2020.01); *G06F 30/331* (2020.01); *G11C 2029/0401* (2013.01)

(58) Field of Classification Search
CPC .. G06F 12/1009; G06F 17/5027; G06F 30/33; G06F 30/331; G06F 9/45504; G06F 9/45525; G11C 2029/0401; G11C 29/00; G11C 29/08; G11C 29/48; G11C 7/10
See application file for complete search history.

(56) References Cited

U.S. PATENT DOCUMENTS

| | | |
|---|---|---|
| 4,969,198 A | 11/1990 | Batchelder et al. |
| 6,108,806 A | 8/2000 | Abramovici et al. |
| 6,429,682 B1 | 8/2002 | Schultz et al. |
| 6,817,006 B1 | 11/2004 | Wells et al. |
| 6,891,395 B2 | 5/2005 | Wells et al. |
| 7,036,059 B1 | 8/2006 | Carmichael et al. |
| 7,187,597 B1 | 3/2007 | Trimberger |
| 7,310,759 B1 | 12/2007 | Carmichael et al. |
| 7,383,479 B1 | 6/2008 | Carmichael et al. |
| 7,512,871 B1 | 3/2009 | Carmichael et al. |
| 7,620,883 B1 | 11/2009 | Carmichael et al. |

(Continued)

*Primary Examiner* — Rehana Perveen
*Assistant Examiner* — Steven W Crabb

(57) ABSTRACT

Programmable integrated circuits may be used to perform hardware emulation of an application-specific integrated circuit (ASIC) design. The ASIC design may be loaded onto the programmable integrated circuit as a device under test (DUT). During hardware emulation operations, an emulation host may be used to coordinate testing of the DUT on the programmable device. In particular, the programmable device may include configurable memory elements such as lookup-table random-access memory (LUTRAM) elements that are operable in a LUT mode and a memory mode. An emulation controller may be used to dynamically assert a global emulation request signal, which forces each LUTRAM element that belong to the DUT in the LUT mode, thereby allowing the emulation host to readily access their internal states without having to perform partial reconfiguration.

20 Claims, 6 Drawing Sheets

(56) References Cited

U.S. PATENT DOCUMENTS

| | | | | |
|---|---|---|---|---|
| 8,812,286 B1* | 8/2014 | Lin | ............... | G06F 30/33 |
| | | | | 703/18 |
| 9,171,111 B1* | 10/2015 | Elmufdi | ............... | G06F 30/331 |
| 2006/0143522 A1* | 6/2006 | Multhaup | ............... | G06F 11/261 |
| | | | | 714/28 |
| 2008/0301360 A1* | 12/2008 | Schmitt | ............... | G11C 7/10 |
| | | | | 711/104 |
| 2013/0055181 A1* | 2/2013 | Suzuki | ............... | G06F 30/331 |
| | | | | 716/106 |
| 2016/0327609 A1* | 11/2016 | Larzul | ............... | G01R 31/3177 |

* cited by examiner

METHODS AND APPARATUS FOR ACCESSING CONFIGURABLE MEMORY DURING HARDWARE EMULATION

BACKGROUND

This relates to integrated circuits and more particularly, to programmable integrated circuits.

Programmable integrated circuits are a type of integrated circuit that can be programmed by a user to implement a desired custom logic function. In a typical scenario, a logic designer uses computer-aided design (CAD) tools to design a custom logic circuit. When the design process is complete, the computer-aided design tools generate configuration data. The configuration data is loaded into memory elements to configure the devices to perform the functions of the custom logic circuit.

In contrast to programmable integrated circuits, application-specific integrated circuits (ASICs) include hardwired circuits that are customized for a particular use rather than for general-purpose use. Since each ASIC is specifically designed for a target application, ASICs are more efficient in terms of performance and area compared to their programmable counterparts (i.e., programmable devices implementing the same target application will exhibit lower performance and larger circuit footprint).

Since ASICs have limited usage compared to general-purpose devices, each iteration of an ASIC design tends to be more costly. While it is possible to simulate an ASIC design entirely in software, it may generally be desirable to simulate the ASIC design on actual hardware before actually taping out the ASIC chip to help ensure that the ASIC design will behave as intended. This hardware simulation process is oftentimes referred to as "hardware emulation" or "ASIC emulation," which involves loading the ASIC design under test on a programmable integrated circuit. Prototyping an ASIC design on a programmable device prior to taping out can help shorten the time to market and reduce cost.

It is within this context that the embodiments described herein arise.

DETAILED DESCRIPTION

Embodiments of the present invention relate to integrated circuits and more particularly, to programmable integrated circuits that are used for hardware emulation. Hardware emulation control circuitry is provided that improves the access time required to read back or overwrite the internal state of memory elements in a device/design under test. Moreover, partial reconfiguration is not needed, which reduces software complexity and may further improve access time.

It will be recognized by one skilled in the art, that the present exemplary embodiments may be practiced without some or all of these specific details. In other instances, well-known operations have not been described in detail in order not to unnecessarily obscure the present embodiments.

Integrated circuits such as programmable integrated circuits use programmable memory elements to store configuration data. During programming of a programmable integrated circuit, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

The programmability of such types of devices can be leveraged to help simulate the behavior of a prototype design under test (sometimes referred to herein as a device under test or "DUT"). For example, it may be desirable to emulate a trial design for an application-specific integrated circuit (ASIC) on a programmable device prior to tape out to help debug, tweak, and/or improve on the final design. This process in which a DUT is first tested on a programmable integrated circuit is sometimes referred to as ASIC emulation, ASIC prototyping, or hardware emulation.

Figure 1:
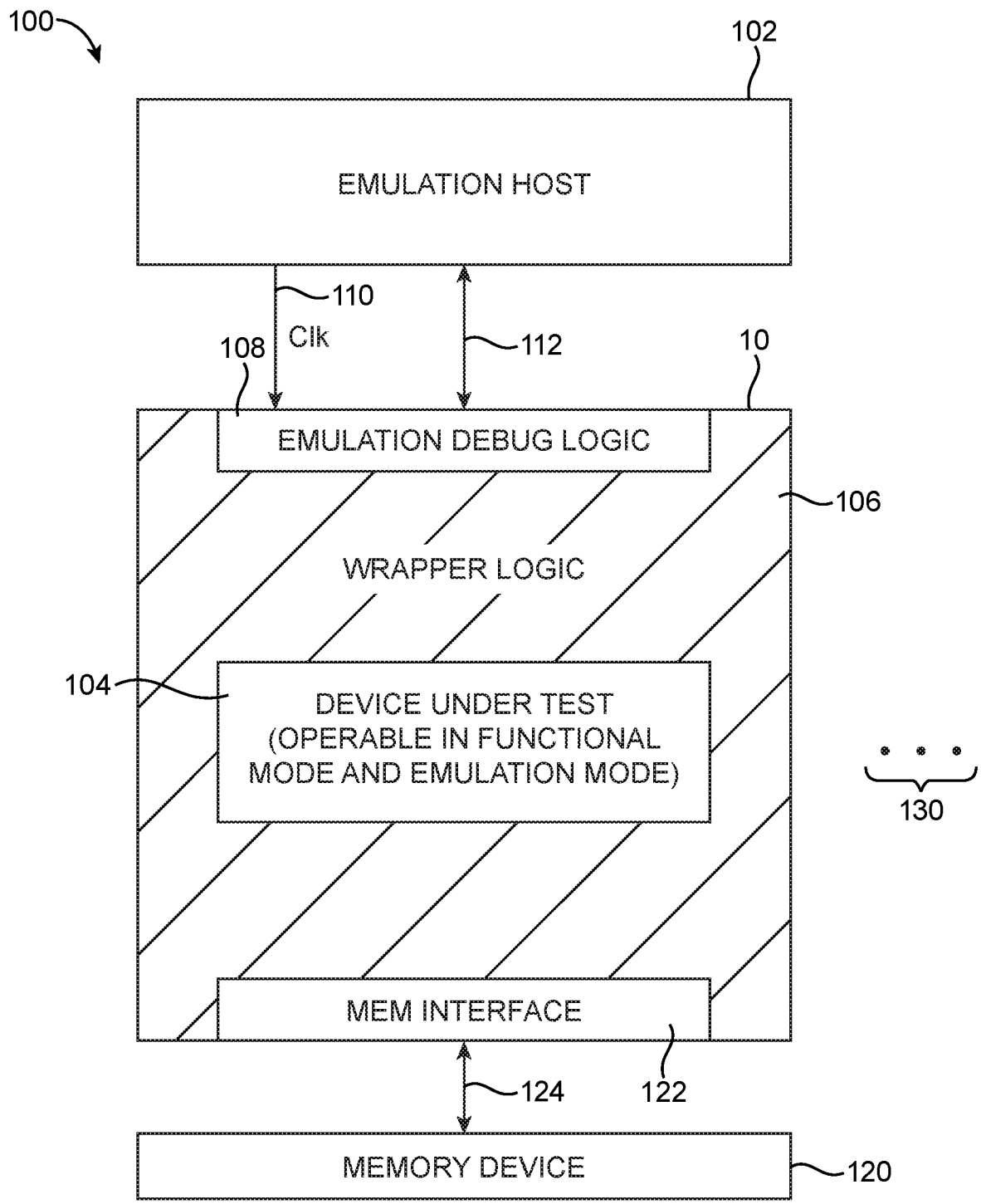
FIG. 1 is a diagram of an illustrative hardware emulation system in accordance with an embodiment.

FIG. 1 is a diagram of a hardware/ASIC emulation system such as system 100. As shown in FIG. 1, ASIC emulation system 100 may include an emulation host such as host 102 and an integrated circuit such as integrated circuit device 10. Device 10 may be a programmable integrated circuit that includes programmable circuitry, a portion of which can be configured as a device under test (DUT) implementing the ASIC design to be tested (see, e.g., DUT portion 104). The remaining portion of device 10 other than DUT portion 104 may be considered wrapper logic 106. In certain embodiments, DUT 104 may require a large amount of memory, which might not be available on device 10. In such scenarios, an external memory component such as off-chip memory device 102 may be used. In the example of FIG. 1, memory 120 may communicate with memory interface 122 on device 10 via bus 124.

Figure 2:
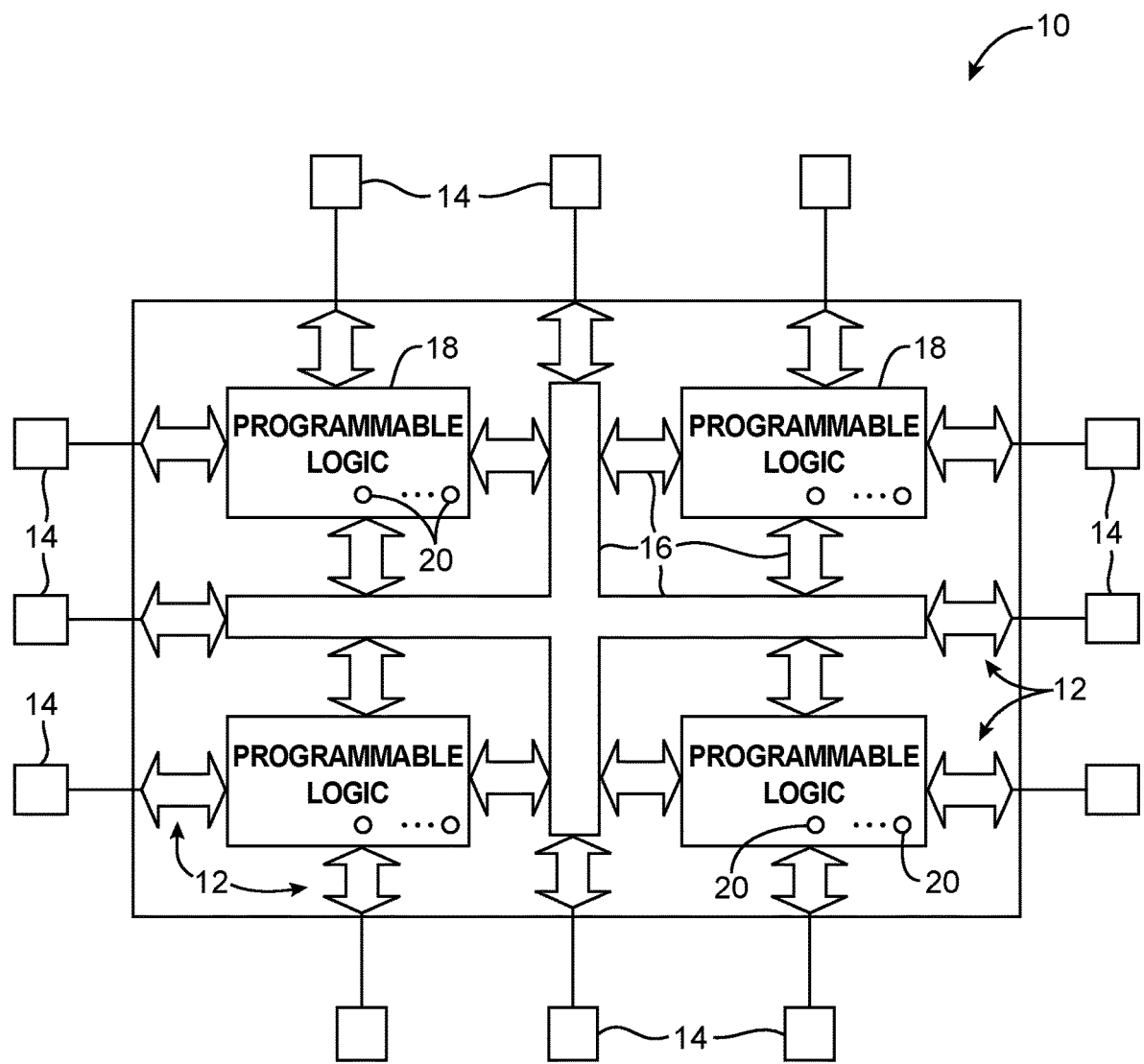
FIG. 2 is a diagram of an illustrative programmable integrated circuit in accordance with an embodiment.

FIG. 2 is a diagram of an illustrative programmable integrated circuit 10. As shown in FIG. 2, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 3:
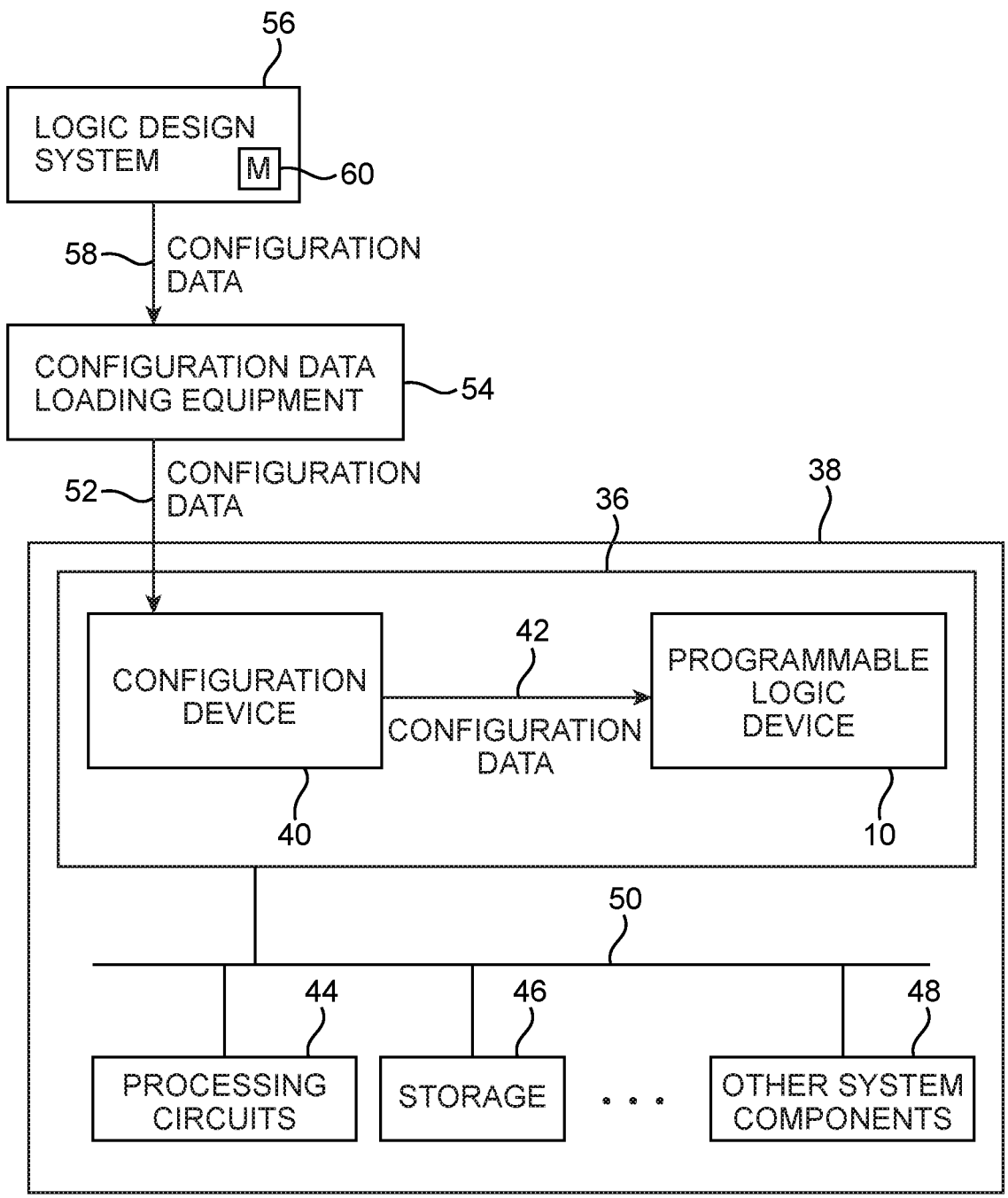
FIG. 3 is a diagram showing how configuration data is created by a logic design system and loaded into a programmable device to configure the device for operation in a system in accordance with an embodiment.

An illustrative system environment for device 10 is shown in FIG. 3. Device 10 may be mounted on a board 36 in a system 38. In general, programmable logic device 10 may receive configuration data from programming equipment or from other suitable equipment or device. In the example of FIG. 3, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 3, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 3.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38. As described above in connection with FIG. 1, at least a portion of device 10 may be configured to implement DUT 104 for ASIC emulation.

Referring back to FIG. 1, in order to fully test DUT 104, it may be desirable to probe or access the internal states of DUT 104. DUT 104 may be operable in (1) a functional mode/phase (e.g., a "normal" mode) during which the design is running normally and (2) an emulation mode/phase (e.g., a "debug" mode) during which the operation is temporarily halted to access the internal states of the DUT. Wrapper logic 106 may be responsible for accessing the internal states of the DUT. Wrapper logic 106 needs to function at all times, either when DUT 104 is running in the functional phase or the emulation phase. Since DUT 104 and wrapper logic 106 coexist in the same core logic fabric of device 10, it may be desirable to access the internal states of DUT 104 without interfering with the operation of wrapper logic 106.

Wrapper logic 106 may also include emulation debug logic 108 for interfacing with emulation host 102. In particular, emulation host 102 may send an emulation clock signal to debug logic 108 via path 110 and may convey other data/control signals to and from device 10 via path 112. Paths 110 and 112 may be a PCIe bus (as an example). The emulation clock signal is used to clock the DUT during functional mode and should be paused during emulation mode. Emulation debug logic 108 can be configured to probe internal signals and internal memory states in DUT 104, to selectively overwrite the internal memory states, to set trigger conditions and breakpoints, and/or to control the emulation clock signal (e.g., to stop or gate the clock signal during emulation mode, to start or allow the clock to run during functional mode, etc.).

In the scenario where a trigger condition has been set up, wrapper logic 106 has visibility to the internal signal of interest in the DUT such that when the trigger condition is met, wrapper logic 106 (e.g., debug logic 108) will stop the emulation clock. In one possible implementation, logic 108 may inform the host that a trigger condition is met, so the host will stop the clock. In another possible implementation, logic 108 may directly access the internal state and store the accessed data in on-chip memory and then inform the host to read the stored data. If desired, other ways of extracting internal DUT states may be employed.

The example of FIG. 1 in which emulation host 102 testes DUT 104 on a single programmable device 10 is merely illustrative and does not serve to limit the scope of the present embodiments. If desired, emulation host 102 may simultaneously test DUTs running on two or more programmable logic devices (PLDs) and/or test multiple DUTs running in each PLD (see ellipses 130).

Programmable integrated circuits may include lookup table random-access memory (LUTRAM) elements grouped into a plurality of LUTRAM arrays, at least some of which may be used to implement the DUT. Each LUTRAM array is configured to operate in either a lookup table (LUT) mode or a random-access memory (RAM) mode. Consider a scenario in which a programmable logic device includes 1000 LUTRAM arrays, 850 of which are currently being used to implement the DUT. Out of the 850 LUTRAM arrays that are used to support the DUT, 300 of them may be initially in RAM mode while 550 of them may be initially in LUT mode.

In order to access the internal states of each LUTRAM array, it may be necessary to switch each DUT's LUTRAM array from its initial designated mode to LUT mode to allow each LUTRAM array to read back its internal states during emulation (e.g., it may be difficult to access the internal states of a LUTRAM through the user path if the LUTRAM is placed in RAM mode). In this example, 300 LUTRAM arrays may temporarily be switched from RAM mode to LUT mode. This switching from initial mode to LUT mode may be conventionally done via partial reconfiguration (i.e., by partially reconfiguring the DUT's LUTRAM arrays while keeping track of its initial state, so that it can later revert them back to its initial state).

After accessing the internal states, partial reconfiguration may be performed again to return each of the DUT's LUTRAM arrays back to its initial mode. This process of switching LUTRAMs from RAM mode to LUT mode prior to emulation and then from LUT mode back to RAM mode after emulation via partial reconfiguration will result in poor LUTRAM access performance and incurs significant software complexity to implement this flow. It may therefore be desirable to provide an improved way to speed up the internal state read back as well as overwriting the internal state.

In accordance with an embodiment, methods and apparatus are disclosed which provide a rapid way for switching the DUT between functional mode and emulation mode without actually interfering with the wrapper logic by using a global emulation request signal and without need to perform a partial reconfiguration on the LUTRAM array.

Programmable integrated circuits 10 include logic circuitry that are often organized into regions of blocks sometimes referred to as logic array blocks ("LABs"). Some of the LABs that include a LUTRAM array are designated memory LABs ("MLABs"). In other words, normal LABs may lack LUTRAM elements. In general, the term LAB used herein may be used to refer to any collection of logic circuits and/or memory elements, which may be instantiated as a repeatable unit.

Figure 4:
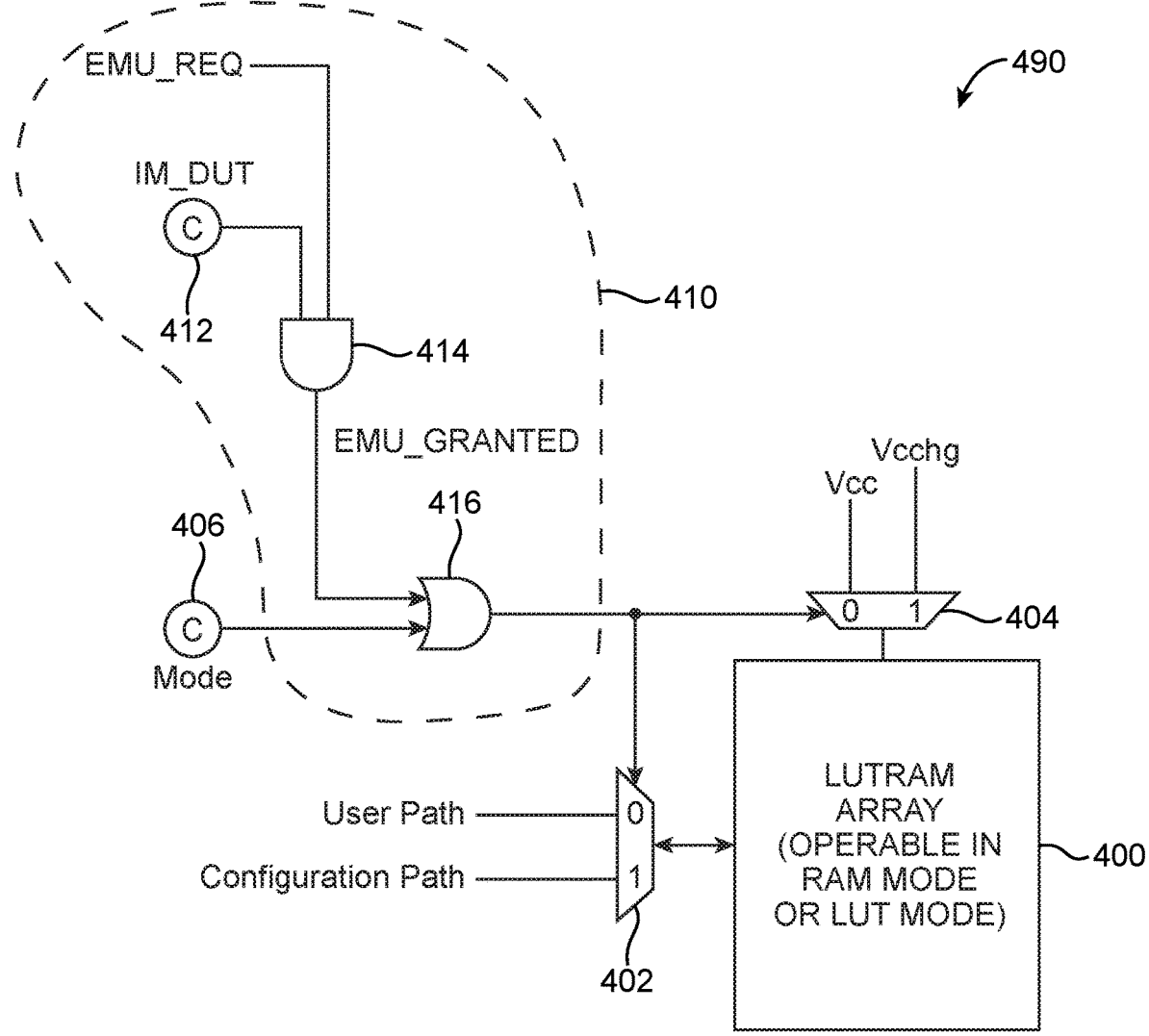
FIG. 4 is a diagram of emulation control circuitry that is capable of dynamically switching a memory element array between a functional mode and an emulation mode in accordance with an embodiment.

FIG. 4 is a diagram of a memory LAB 490. As shown in FIG. 4, MLAB 490 may include a LUTRAM array 400, an access port that is coupled to access multiplexer 402, a power supply port that is coupled to power multiplexer 404, and associated emulation control logic circuitry 410 that controls multiplexers 402 and 404. Multiplexer 402 may have a first (0) terminal that is coupled to a user path, a second (1) terminal that is coupled to a configuration path, and a third terminal that is coupled to the access port of array 400. Multiplexer 404 may have a first (0) terminal that receives positive power supply voltage Vcc, a second (1) terminal that receives elevated power supply voltage Vcchg, and a third terminal that is coupled to the power supply port of array 400. Power supply Vcchg may be greater than Vcc. For example, nominal power supply voltage Vcc may be equal to 0.8V, whereas elevated or "overdrive" voltage Vcchg may be equal to 1.2V.

Multiplexers 402 and 404 may be controlled using a configuration memory element 406. Memory element 406 (e.g., a random-access memory element or a non-volatile memory element) that stores a mode control signal Mode. If signal Mode is low, LUTRAM array 400 may be initially operated in RAM mode, which configures multiplexer 402 to use the user path and configures multiplexer 404 to use nominal power supply Vcc. If signal Mode is high, LUTRAM array 400 may be initially operated in LUT mode, which configures multiplexer 402 to use the configuration path and configures multiplexer 404 to use overdrive voltage Vcchg.

Hardware emulation control logic 410 may be used to selectively override the mode control signal during emulation (or debug) mode. Logic 410 may include a memory element 412 for storing a IM_DUT bit, a logic AND gate 414, and a logic OR gate 416. The IM_DUT bit may be used to specify whether this particular MLAB 490 is currently being used by the DUT. If the IM_DUT bit is high (i.e., a logic "1"), the MLAB belongs to the DUT. If the IM_DUT bit is low (i.e., a logic "0"), the MLAB belongs to the wrapper logic. This is merely illustrative. If desired, a low IM_DUT bit may instead indicate that the MLAB belongs to a DUT, whereas a high IM_DUT bit may instead indicate that the MLAB belongs to the wrapper logic. During the emulation/debug mode, MLABs that are DUTs may be configured in LUT mode to improve accessibility.

Logic AND gate 414 may have a first input that receives the IM_DUT bit from element 412, a second input that receives signal EMU_REQ, and an output. Signal EMU_REQ may be a global signal that is asserted only when the emulation host would like to perform an emulation access to the DUT. An EMU_GRANTED signal may be generated at the output of gate 414. Signal EMU_GRANTED may be asserted if and only if the IM_DUT bit and signal EMU_REQ are both asserted (e.g., EMU_GRANTED will be high only when IM_DUT and EMU_REQ are both at logic "1").

Logic OR gate 416 has a first input that receives signal EMU_GRANTED from gate 414, a second input that receives the mode control signal from element 406, and an output that controls multiplexers 402 and 404. Configured in this way, an asserted EMU_GRANTED would override the mode control signal to force LUTRAM array 400 to LUT mode (e.g., by forcing both the read/write access mux and the power mux to choose the configuration path and Vcchg, respectively). As illustrated in this example, the mode toggling can be efficiently implemented using a dynamically adjustable global emulation request signal EMU_REQ, which effectively overrides signal MODE without having to perform partial reconfiguration. The use of emulation control logic 410 makes it easy for a programmable logic device to support ASIC emulation.

Figure 5:
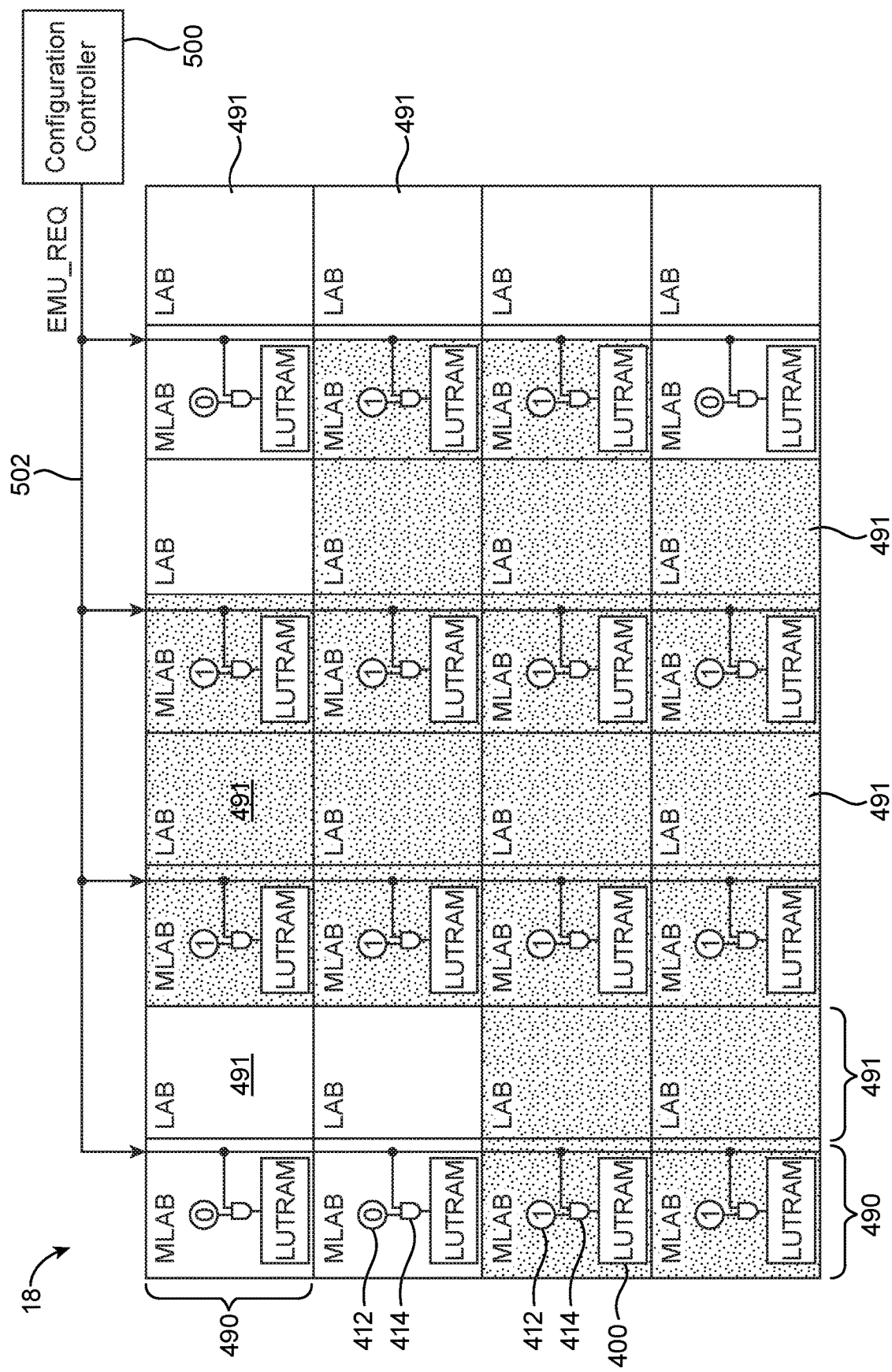
FIG. 5 is a diagram showing how a subset of logic array blocks on a programmable integrated circuit can be controlled using a global emulation request signal in accordance with an embodiment.

FIG. 5 is a diagram showing the full-chip view of core logic fabric 18 on programmable integrated circuit 10 (see FIG. 2). As shown in FIG. 5, core logic fabric 18 may include MLABs 490 and LABs 491. Only MLABs 490 may include a LUTRAM array. The logic regions that belong to the DUT are shaded, whereas the logic regions that belong to the wrapper logic are unshaded. Note how each shaded MLAB includes a memory element 412 storing a high IM_DUT bit, whereas each unshaded MLAB includes a memory element 412 storing a low IM_DUT bit.

In particular, device 10 may include a configuration controller such as controller 500 that outputs a global EMU_REQ signal to each of the MLABs 490. Global signal EMU_REQ will only affect MLABs that belong to the DUT since AND gate 414 will prevent signal EMU_REQ from affecting the LUTRAM array for all MLABs belonging to the wrapper logic. Configuration controller 500 may be formed as part of wrapper logic 106, part of emulation debug logic 108, or other part of the programmable integrated circuit (FIG. 1).

Figure 6:
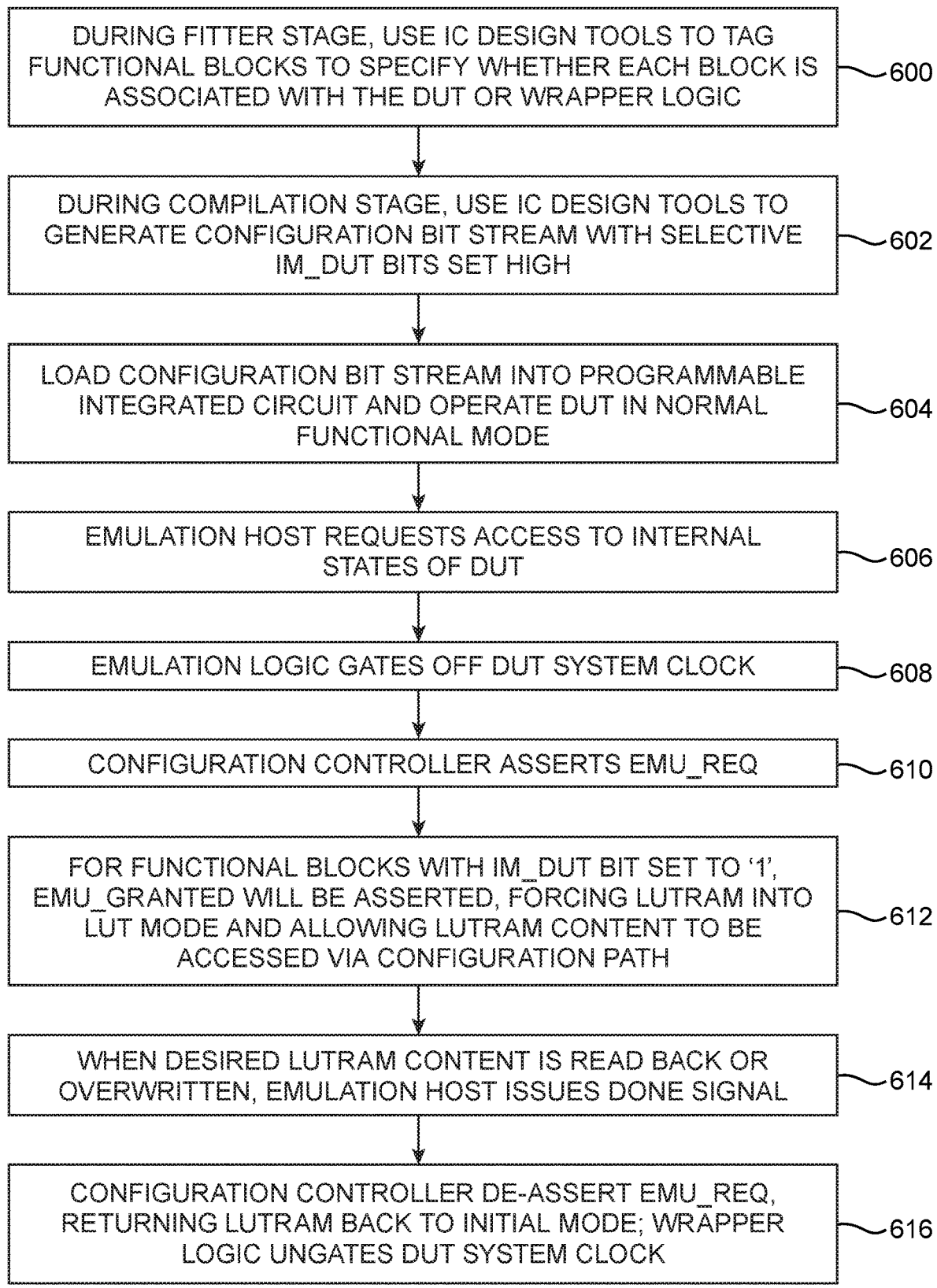
FIG. 6 is a flowchart of illustrative steps for operating a programmable integrated circuit to support hardware emulation in accordance with an embodiment.

FIG. 6 is a flowchart of illustrative steps for operating a programmable integrated circuit to support ASIC emulation. During a fitter stage (step 600), integrated circuit design tools such as tools 56 of FIG. 3 may be used to tag functional blocks to specify whether each block is associated with design/device under test (DUT) 104 or wrapper logic 106. For example, some of the LABs and MLABs on device 10 will be marked as belonging to the DUT, whereas others will be assigned to belong to the wrapper logic. The fitter stage is sometimes known as the "place and route" step in the logic synthesis flow.

During compilation stage (step 602), the IC design tools may be used to generate a configuration bit stream with selective IM_DUT bits set high. In other words, the configuration bit stream will specify that logic regions belonging to the DUT have their IM_DUT bits asserted while logic regions belonging to the wrapper logic have their IM_DUT bits deasserted. The DUT portion of the configuration bit stream effectively implements the ASIC design that is to be tested during emulation.

At step 604, configuration equipment may be used to load the configuration bit stream onto a programmable integrated circuit (e.g., programmable logic device 10). After loading, the DUT on device 10 may be operated in normal functional mode.

After the DUT has been running for some time, emulation host 102 may request access or probe the internal states of the DUT (step 606). This signifies the beginning of the emulation phase. At step 608, emulation debug logic 108 may gate off the emulation system clock to temporarily halt the operation of the DUT.

At step 610, configuration controller 500 (which may be part of the wrapper logic on device 10) may assert global control signal EMU_REQ. For functional blocks having their IM_DUT bits set high, assertion of signal EMU_REQ will cause signal EMU_GRANTED to be asserted, thereby forcing the corresponding LUTRAM array into LUT mode (step 612). Selectively forcing LUTRAMs belonging to the DUT into LUT mode allows the LUTRAM content to be accessed via the configuration path during emulation.

After the desired LUTRAM content has been read back or overwritten by the emulation host, the emulation host may then issue a done signal (step 614). At step 626, the configuration controller may deassert global signal EMU_REQ, which returns each LUTRAM array back to its initial mode (i.e., either back to RAM mode or remains in LUT mode). The wrapper logic may then ungate the emulation system clock, which allows the DUT to operate in active functional mode.

These steps are merely illustrative. The existing steps may be modified or omitted; some of the steps may be performed in parallel; additional steps may be added; and the order of certain steps may be reversed or altered. Also, the example of FIG. 7 in which memory cells 400 are only operated in two different modes is merely illustrative. If desired, the LUTRAM memory elements may be any suitable type of multimode memory cells operable in three or more different modes, five or more different modes, ten or more different modes, etc. If desired, other ways of dynamically placing functional blocks in the desired mode of operation, whether using global signals or local signals, during the ASIC prototyping phase may be employed.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a plurality of logic blocks, a first portion of which is configured as a device under test (DUT) and a second portion of which is configured as wrapper logic, wherein each of the logic blocks is operable in first and second modes; and a configuration controller that asserts a global emulation request signal, wherein the assertion of the global emulation request signal forces each of the logic blocks in the first portion into the first mode.

Example 2 is the integrated circuit of Example 1, wherein the first mode comprises an emulation mode, and wherein the second mode comprises a normal mode for that logic block.

Example 3 is the integrated circuit of Examples 1-2, wherein each of the logic blocks optionally further includes a first logic gate having a first input that receives the global emulation request signal, a second input that receives a bit indicating whether that logic block belongs to the DUT, and an output on which an emulation grant signal is provided.

Example 4 is the integrated circuit of Examples 1-3, wherein the first logic gate optionally comprises a logic AND gate.

Example 5 is the integrated circuit of Examples 1-4, wherein each of the logic blocks optionally further includes a second logic gate having a first input that receives the emulation grant signal from the first logic gate in that logic block, a second input that receives a bit indicating whether the array of memory elements in that logic block is initially placed in the first mode or the second mode, and an output on which a control signal is provided.

Example 6 is the integrated circuit of Examples 1-5, wherein the second logic gate optionally comprises a logic OR gate.

Example 7 is the integrated circuit of Examples 1-6, wherein each of the logic blocks optionally further includes a first multiplexer that is coupled to read and write access ports of the array of memory elements in that logic block and a second multiplexer that is coupled to power supply ports of the array of memory elements in that logic block, and wherein the first and second multiplexers are optionally controlled by the control signal output by the second logic gate in that logic block.

Example 8 is a method of operating an integrated circuit that includes a memory element array, the method comprising: configuring the memory element array to operate in a first mode during a functional phase of the integrated circuit; and asserting a global emulation request signal that forces the memory element array to operate in a second mode during an emulation phase of the integrated circuit.

Example 9 is the method of Example 8, wherein configuring the memory element array to operate in the first mode optionally comprises configuring the memory element array to operate in a random-access memory (RAM) mode during the functional phase.

Example 10 is the method of Examples 8-9, wherein forcing the memory element array to operate in the second mode optionally comprises forcing the memory element array to operate in a lookup table (LUT) mode during the emulation phase.

Example 11 is the method of Examples 8-10, wherein a first portion of the integrated circuit is optionally configured as a device under test (DUT), and wherein a second portion of the integrate circuit is optionally configured as wrapper logic, the method optionally further comprising: with a first memory cell that is separate from the memory element array, storing a first bit that indicates whether the memory element array is part of the DUT or the wrapper logic.

Example 12 is the method of Examples 8-11, the method optionally further comprising: with a second memory cell that is separate from the memory element array, storing a second bit that initially sets the first mode of the memory element array; with a first logic gate, receiving the first bit and the global emulation request signal and outputting an emulation grant signal; and with a second logic gate, receiving the second bit and the emulation grant signal and outputting a control signal that controls the memory element array.

Example 13 is the method of Examples 8-12, the method optionally further comprising: receiving an emulation clock signal that clocks the memory element array during the functional phase; and during the emulation phase, gating off the emulation clock signal.

Example 14 is the method of Examples 8-13, the method optionally further comprising: while the emulation clock signal is gated off, accessing internal states of the memory element array.

Example 15 is the method of Examples 8-14, optionally further comprising: after the internal states of the memory element array have been accessed, deasserting the global emulation request signal so that the memory element array is reverted back to the first mode.

Example 16 is a hardware emulation system, comprising: a programmable integrated circuit that is configured to implement a design under test (DUT), wherein the DUT is operable in a functional mode and an emulation mode; and an emulation host that is coupled to the programmable integrated circuit and that performs hardware emulation of the DUT on the programmable integrated circuit without performing partial reconfiguration on the programmable integrated circuit.

Example 17 is the hardware emulation system of Example 16, wherein the programmable integrated circuit optionally includes a configuration controller that asserts a global emulation request signal that places the DUT in the emulation mode.

Example 18 is the hardware emulation system of Examples 16-17, wherein the emulation host optionally includes a configuration controller that asserts a global emulation request signal that places the DUT in the emulation mode.

Example 19 is the hardware emulation system of Examples 16-18, wherein the programmable integrated circuit optionally further includes wrapper logic that surrounds the DUT, and wherein the wrapper logic is unaffected during the emulation mode.

Example 20 is the hardware emulation system of Examples 16-19, wherein the wrapper logic optionally comprises emulation debug logic that is configured to: access internal signals within the DUT; set a trigger condition; and gate an emulation clock that is fed from the emulation host to the programmable integrated circuit in response to determining that the trigger condition has been met.

Example 21 is an integrated circuit comprising: a memory element array; means for configuring the memory element array to operate in a first mode during a functional phase of the integrated circuit; and means for asserting a global emulation request signal that forces the memory element array to operate in a second mode during an emulation phase of the integrated circuit.

Example 22 is the integrated circuit of Example 21, wherein the means for configuring the memory element array to operate in the first mode optionally comprises means for configuring the memory element array to operate in a random-access memory (RAM) mode during the functional phase.

Example 23 is the integrated circuit of Examples 21-22, wherein the means for forcing the memory element array to operate in the second mode optionally comprises means for forcing the memory element array to operate in a lookup table (LUT) mode during the emulation phase.

Example 24 is the integrated circuit of Examples 21-23, wherein a first portion of the integrated circuit is optionally configured as a device under test (DUT), and wherein a second portion of the integrate circuit is optionally configured as wrapper logic, the integrated circuit optionally comprising means for storing a first bit that indicates whether the memory element array is part of the DUT or the wrapper logic.

Example 25 is the integrated circuit of Examples 21-24, optionally further comprising: means for storing a second bit that initially sets the first mode of the memory element array; means for receiving the first bit and the global emulation request signal and outputting an emulation grant signal; and means for receiving the second bit and the emulation grant signal and outputting a control signal that controls the memory element array.

Example 26 is the integrated circuit of Examples 21-25, optionally further comprising: means for receiving an emulation clock signal that clocks the memory element array during the functional phase; and means for gating off the emulation clock signal during the emulation phase.

Example 27 is the integrated circuit of Examples 21-26, optionally further comprising means for accessing internal states of the memory element array while the emulation clock signal is gated off.

Example 28 is the integrated circuit of Examples 21-27, optionally further comprising means for deasserting the global emulation request signal so that the memory element array is reverted back to the first mode after the internal states of the memory element array have been accessed.

For instance, all optional features of the apparatus described above may also be implemented with respect to the method or process described herein. The foregoing is merely illustrative of the principles of this disclosure and various modifications can be made by those skilled in the art.

What is claimed is:

1. An integrated circuit, comprising:
a plurality of logic blocks comprising a first portion that is configurable as a device under test (DUT) and a second portion that is configurable as wrapper logic, wherein each of the logic blocks in the first portion is operable in first and second modes; and
a configuration controller operable to provide a global emulation request signal to each of the logic blocks in the first portion and to each of the logic blocks in the second portion, wherein an assertion of the global emulation request signal causes each of the logic blocks in the first portion to operate in the first mode that comprises an emulation mode during which operation of the DUT is halted to access internal states of the DUT, and wherein a logic circuit in each of the logic blocks in each of the first and second portions controls whether the logic block is part of the DUT or part of the wrapper logic in response to a bit.

2. The integrated circuit of claim 1, wherein the second mode comprises a normal mode for that logic block, and wherein each of the logic blocks comprises a first logic gate that prevents the global emulation request signal from affecting memory arrays in the logic blocks in the second portion.

3. The integrated circuit of claim 2, wherein the first logic gate has a first input that receives the global emulation request signal, a second input that receives a bit indicating whether that logic block belongs to the DUT, and an output on which an emulation grant signal is provided.

4. The integrated circuit of claim 3, wherein the first logic gate comprises a logic AND gate.

5. The integrated circuit of claim 3, wherein each of the logic blocks further includes a second logic gate having a first input that receives the emulation grant signal from the first logic gate in that logic block, a second input that receives a bit indicating whether an array of memory elements in that logic block is initially placed in the first mode or the second mode, and an output on which a control signal is provided.

6. The integrated circuit of claim 5, wherein the second logic gate comprises a logic OR gate.

7. The integrated circuit of claim 5, wherein each of the logic blocks further includes a first multiplexer that is coupled to read and write access ports of the array of memory elements in that logic block and a second multiplexer that is coupled to power supply ports of the array of memory elements in that logic block, and wherein the first and second multiplexers are controlled by the control signal output by the second logic gate in that logic block.

8. A method of operating an integrated circuit that includes a memory element array, the method comprising:
configuring the memory element array to operate in a first mode during a functional phase of the integrated circuit, wherein a first portion of the integrated circuit is configured as a device under test (DUT), and wherein a second portion of the integrated circuit is configured as wrapper logic;
generating an emulation request signal that forces the memory element array to operate in a second mode during an emulation phase of the integrated circuit;
receiving an emulation clock signal that clocks the memory element array during the functional phase;
during the emulation phase, gating off the emulation clock signal using the wrapper logic to halt operation of the DUT; and
controlling whether the memory element array is part of the DUT or part of the wrapper logic in response to a first bit.

9. The method of claim 8, wherein configuring the memory element array to operate in the first mode comprises configuring the memory element array to operate in a random-access memory (RAM) mode during the functional phase.

10. The method of claim 8, wherein forcing the memory element array to operate in the second mode comprises forcing the memory element array to operate in a lookup table (LUT) mode during the emulation phase.

11. The method of claim 8, wherein
a first memory cell that is separate from the memory element array stores the first bit that indicates whether the memory element array is part of the DUT or the wrapper logic.

12. The method of claim 11, further comprising:
with a second memory cell that is separate from the memory element array, storing a second bit that initially sets the first mode of the memory element array;
with a first logic gate, receiving the first bit and the emulation request signal and outputting an emulation grant signal; and
with a second logic gate, receiving the second bit and the emulation grant signal and outputting a control signal that controls the memory element array.

13. The method of claim 8, further comprising:
while the emulation clock signal is gated off, accessing internal states of the memory element array.

14. The method of claim 13, further comprising:
after the internal states of the memory element array have been accessed, deasserting the emulation request signal so that the memory element array is reverted back to the first mode.

15. A hardware emulation system, comprising:
an integrated circuit that is configured to implement a design under test (DUT) using a first portion of the integrated circuit, wherein the DUT is operable in a functional mode and in an emulation mode; and
an emulation host that is coupled to the integrated circuit and that performs hardware emulation of the DUT on the integrated circuit, wherein the emulation host is configured to provide an emulation clock signal to the integrated circuit to clock the DUT during the functional mode, wherein the emulation clock signal is stopped by wrapper logic during the emulation mode, wherein a global emulation request signal is configured to selectively place the DUT in the emulation mode, wherein the wrapper logic is formed from a second portion of the integrated circuit, and wherein a logic circuit in each logic block in each of the first and second portions controls whether the logic block is part of the DUT or part of the wrapper logic in response to a bit.

16. The hardware emulation system of claim 15, wherein the integrated circuit includes a configuration controller that asserts the global emulation request signal that places the DUT in the emulation mode.

17. The hardware emulation system of claim 15, wherein the emulation host includes a configuration controller that asserts the global emulation request signal that places the DUT in the emulation mode.

18. The hardware emulation system of claim 15, wherein the wrapper logic that surrounds the DUT, and wherein the wrapper logic is unaffected by the global emulation request signal during the emulation mode.

19. The hardware emulation system of claim 18, wherein the wrapper logic comprises emulation debug logic that is configured to:
- access internal signals within the DUT;
- set a trigger condition; and
- stop the emulation clock signal that is provided from the emulation host to the integrated circuit in response to determining that the trigger condition has been met.

20. The hardware emulation system of claim 15, wherein the logic circuit receives the global emulation request signal at an input.

* * * * *